United States Patent
Tsang et al.

(10) Patent No.: US 8,721,352 B2
(45) Date of Patent: May 13, 2014

(54) SYSTEM FOR INTERCONNECTING PRINTED CIRCUIT BOARDS

(75) Inventors: Albert Tsang, Harrisburg, PA (US);
Nicholas Paul Ruffini, York, PA (US);
Kevin Michael Thackston, York, PA (US); Matthew Richard McAlonis, Elizabethtown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 122 days.

(21) Appl. No.: 13/467,251

(22) Filed: May 9, 2012

(65) Prior Publication Data
US 2013/0303003 A1 Nov. 14, 2013

(51) Int. Cl.
*H01R 9/00* (2006.01)
(52) U.S. Cl.
USPC ............................................ 439/78; 439/908
(58) Field of Classification Search
USPC .................................................. 439/78, 908
See application file for complete search history.

(56) References Cited

U.S. PATENT DOCUMENTS

| | | | |
|---|---|---|---|
| 4,296,390 A * | 10/1981 | Vanderheyden et al. | 333/182 |
| 4,869,677 A | 9/1989 | Johnson et al. | |
| 5,181,855 A | 1/1993 | Mosquera et al. | |
| 5,211,567 A * | 5/1993 | Neumann et al. | 439/74 |

FOREIGN PATENT DOCUMENTS

| | | |
|---|---|---|
| EP | 0 374 307 A1 | 6/1990 |
| GB | 2 185 160 A | 7/1987 |

OTHER PUBLICATIONS

International Search Report, International Application No. PCT/US2013/039210, International Filing Date, May 2, 2013.

* cited by examiner

*Primary Examiner* — Gary Paumen

(57) ABSTRACT

A system for communicating between multiple electrical components includes a first printed circuit board (PCB) having first and second opposed layers and a plurality of plated through-holes extending between the first and second opposed layers. The system also includes a plurality of mating contacts, wherein each of the plurality of mating contacts is retained within one of the plurality of plated through-holes. Each of the plurality of mating contacts may include a first end portion that outwardly extends from the first layer, and a second end portion that outwardly extends from the second layer. The system may also include a first connector assembly having a plurality of interconnecting contacts retained therein. The plurality of interconnecting contacts mate with the first end portions of the plurality of mating contacts when the first connector assembly connects to the first PCB.

20 Claims, 4 Drawing Sheets

SYSTEM FOR INTERCONNECTING PRINTED CIRCUIT BOARDS

BACKGROUND

The subject matter herein relates generally to a system for electrically and mechanically interconnecting printed circuit boards.

Electrical connectors mechanically and electrically interconnect circuit boards and other electrical components. An electrical connector is typically mounted to a circuit board and mated to a mating connector, which may be board-mounted or cable-mounted. Typically, an electrical connector includes a main housing that retains a plurality of electrical contacts that electrically and mechanically connect to conductive vias, traces, or the like on or within a printed circuit board. The circuit board and the electrical connectors are mounted within an electronic device at a particular location.

In various systems, multiple circuit boards are configured to communicate with one another. In some configurations, the circuit boards are parallel daughter circuit boards that connect to an orthogonal back-plane. In other configurations, the parallel circuit boards are connected to one another through stacking connectors. Feed-through connectors are examples of stacking connectors that house long contacts that attach to one side of a printed circuit board, and protrude out of an opposing side of the printed circuit board. In general, the contacts are relatively long and typically require that the contact protrusion be dimensioned to fit through a plated through-hole within the printed circuit board. For example, in order to provide a connection through a printed circuit board, each contact is formed of a unitary construction that passes through the printed circuit board such that one mating end extends out of a surface of the printed circuit board, while an opposite mating end extends out of an opposite surface of the printed circuit board. One mating end is then positioned within a first connector housing, while the other mating end is then positioned within a second connector housing. However, the connector contacts typically need to be large and long enough to accommodate the long distances between boards, thereby limiting the types of connectors that may be used with such a system. Moreover, it has been found that the positions of the long contacts within the connector housings and/or at mating interfaces may shift or otherwise not maintain proper positioning. For example, the long contacts may be susceptible to bending, warping, or the like when the printed circuit board is mated with the connector housings.

SUMMARY

Certain embodiments provide a system for communicating between multiple electrical components. The system may include a first printed circuit board (PCB) having first and second opposed layers and a plurality of plated through-holes extending between the first and second opposed layers.

The system may also include a plurality of mating contacts, wherein each of the plurality of mating contacts is retained within one of the plurality of plated through-holes. Each of the plurality of mating contacts may include a first end portion that outwardly extends from the first layer or first PCB, and a second end portion that outwardly extends from the second layer or second PCB.

The system may also include a first connector assembly having a plurality of interconnecting contacts retained therein. The first connector assembly is configured to connect to the first PCB. As such, before connection, the first connector assembly is separate and distinct from the first PCB. The first connector assembly may later be disconnected from the first PCB and the first connector assembly may be replaced with another connector assembly. In this manner, the first connector assembly and the first PCB may be interchanged and replaced. The plurality of interconnecting contacts mate with the first end portions of the plurality of mating contacts when the first connector assembly connects to the first PCB, and the plurality of interconnecting contacts separate from the first end portions of the plurality of mating contacts when an individual disconnects the first connector assembly from the first PCB.

The first connector assembly may also include a plurality of connector mating contacts connected to the plurality of interconnecting contacts. The plurality of connector mating contacts may connect to the plurality of interconnecting contacts through plating within the first connector assembly. Optionally, the plurality of connector mating contacts may connect to the plurality of interconnecting contacts through opposed conductors within the first connector assembly.

Each of the plurality of interconnecting contacts may include a pin integrally formed with a contact-engaging member that mates with the first end portion. The contact-engaging member may include opposed prongs separated by a tail-engaging channel. Each of the first end portions of the plurality of mating contacts may include an eye-of-the-needle contacting portion.

The system may also include a second connector assembly. The second end portions of the mating contacts may be retained within the second connector assembly.

The system may also include a second PCB connected to the first connector assembly. The system may also include a third PCB connected to the second connector assembly.

The first PCB may include a passage. The first connector assembly may include an alignment post that is retained within the passage. In this manner, the first PCB may properly mate with the first connector assembly. The first connector assembly may include a receptacle connector mated with a header connector.

Certain embodiments provide a system for communicating between multiple electrical components. The system may include a first printed circuit board (PCB) having first and second opposed layers and a plurality of plated through-holes extending between the first and second opposed layers.

The system may also include a plurality of PCB mating contacts, wherein each of the plurality of PCB mating contacts is retained within one of the plurality of plated through-holes. Each of the plurality of PCB mating contacts may include first and second end portions integrally connected to one another through an intermediate middle section. Each of the intermediate middle sections may be retained within the PCB. Each of the first end portions may outwardly extend from the first layer, and each of the second end portions may outwardly extend from the second layer.

The system may also include a first connector assembly having a plurality of interconnecting contacts and a plurality of PCB mating contacts retained therein. The plurality of interconnecting contacts mate with the first end portions of the plurality of mating contacts when the first connector assembly connects to the first printed circuit board. The plurality of interconnecting contacts are separate and distinct from the first end portions of the plurality of mating contacts when the first connector assembly disconnects from the printed circuit board. The plurality of connector mating contacts are connected to the plurality of interconnecting contacts within the first connector assembly.

The system may also include a second connector assembly. The second end portions of the PCB mating contacts may be retained within the second connector assembly.

The system may also include a second PCB connected to the first connector assembly, and a third PCB connected to the second connector assembly.

DETAILED DESCRIPTION

Figure 1:
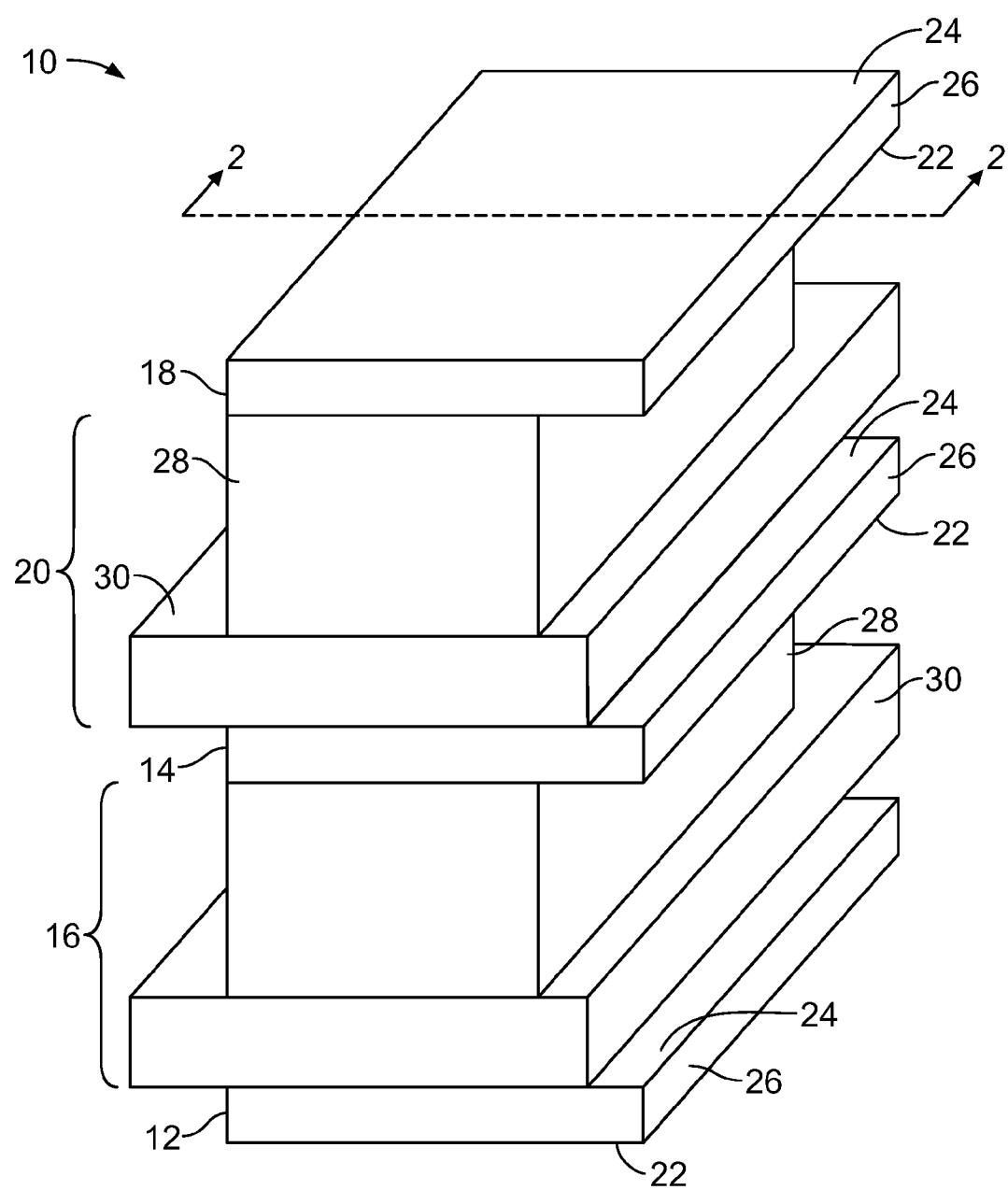
FIG. 1 illustrates a simplified perspective view of a connector system, according to an embodiment.

FIG. 1 illustrates a simplified perspective view of a connector system 10, according to an embodiment. The system 10 includes a printed circuit board (PCB) 12 connected to a PCB 14 through a connector assembly 16. The PCB 14 is, in turn, connected to another PCB 18 through another connector assembly 20. As shown, the PCB 12, 14, and 18 may be parallel with one another.

Each PCB 12, 14, and 16 may include opposed layers, such as opposed layers 22 and 24 connected together through a dielectric housing 26. Each layer 22 and 24 may include a ground plane used as a grounding surface. Each layer 22 and 24 may include etches for signal traces. Signal and ground vias, through-holes, and the like (not shown) may pass through the housing 26 and connect the layers 22 and 24 to one another. The vias, through-holes, and the like may electrically connect signal traces (not shown) that may be positioned on outer surfaces of the layers 22 and 24. The vias, through-holes, and the like are configured to receive and retain portions of mating contacts housed within the connector assemblies 16 and 20.

Each connector housing 16 and 20 may include a socket or receptacle connector 28 that mates with a shroud or header connector 30. The connector housings 16 and 20 may retain mating contacts and/or pins that electrically connect to the PCBs 12, 14, and 18. The PCBs 12, 14, and 18 are parallel to one another and, as discussed below, are configured to communicate with one another without the use of an orthogonal back plane. The system 10 may include more PCBs and connector assemblies than those shown. For example, an additional PCB may connect to the PCB 18 through an additional connector assembly, while another PCB may connect to the PCB 12 through another connector assembly.

Figure 2:
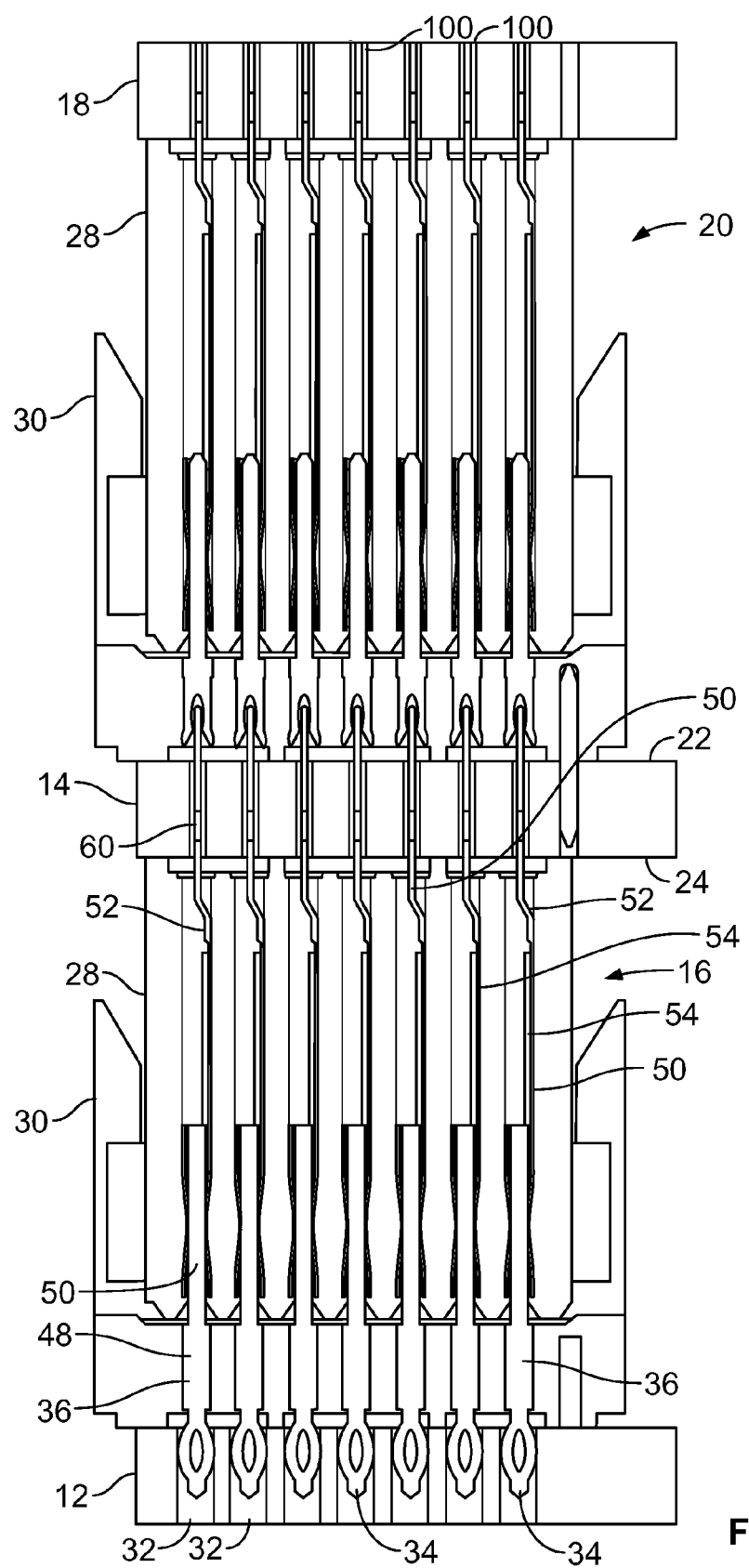
FIG. 2 illustrates a cross-sectional view of a connector system through line 2-2 of FIG. 1, according to an embodiment.

FIG. 2 illustrates a cross-sectional view of the connector system 10 through line 2-2 of FIG. 1, according to an embodiment. The PCB 12 includes plated through-holes 32 that retain contact tails, protrusions, or the like 34 of mating contacts 36.

Figure 3:
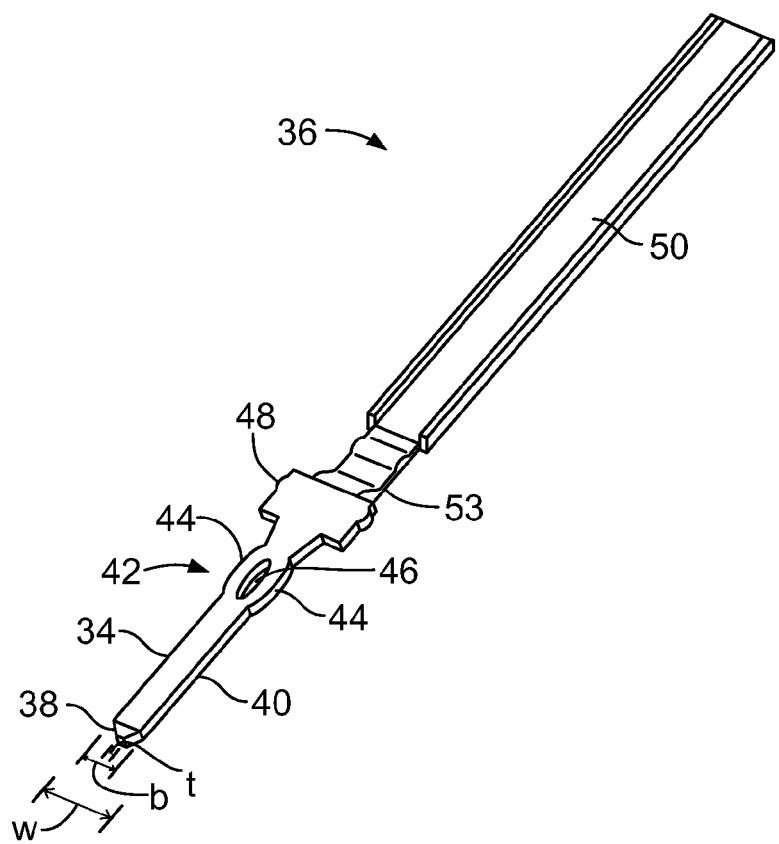
FIG. 3 illustrates a perspective view of a mating contact, according to an embodiment.

FIG. 3 illustrates a perspective view of a mating contact 36, according to an embodiment. The mating contact 36 may be retained by the connector assembly 16, and, as such, may be referred to as a connector mating contact 36. The mating contact 36 is formed of a conductive material, such as a metal. Referring to FIGS. 2 and 3, each mating contact 36 includes an end portion, such as a contact tail 34 having a beveled distal tip 38. The beveled distal tip 38 is configured to slide into a through-hole 32. Because the beveled distal tip 38 has a smaller diameter or width than the through-hole 32, the contact tail 34 is able to easily pass into the through-hole 32. The distal tip 38 integrally connects to a beam 40 having a width b that is greater than the diameter of the tip 38. The beam 40 is configured to securely abut into plated walls of the PCB 12 that define a through-hole 32. The beam 40 is, in turn, integrally connected to an expanded eye-of-the-needle contacting portion 42. The contacting portion 42 includes opposed outwardly-bowed legs 44 separated by an internal opening 46. The legs 44 securely abut into conductive wall portions of the through-hole 32 so that signals may pass from the mating contact 36 to the PCB 12, and vice versa.

The contacting portion 42 is, in turn, integrally connected to a receptacle-retaining block 48 having a width w greater than that of the beam 40. The block 48 is configured to be securely retained within a channel formed through the header connector 30. The block 48 is, in turn, integrally connected to another end portion, such as an extension blade 50 that is retained within a channel formed through the receptacle connector 28. As shown, the blade 50 may be a planar blade that is offset with respect to the block 48 through a curved intermediate section 53. Optionally, the entirety of the mating contact 36 may lie within a common plane. The block 48 may be sized shorter or longer than that shown in FIG. 3, in order to be sized and shaped to be securely retained by a reciprocal channel formed within the header connector 30.

The blade 50 of each mating contact 36 retained within the receptacle connector 28 of the connector housing 16 electrically connects to another mating contact 52 (which may be retained by the PCB 14 or a connector assembly connected to the PCB 14, and may therefore be referred to as a PCB mating contact 52) that extends into and out of the receptacle connector 28. The mating contact 52 may directly connect to the blade 50 and/or through conductive plating 54 within each channel formed through the receptacle connector 28. The mating contact 52 may be configured in a similar manner as the mating contact 36. However, the mating contact 52 may include a longer blade 54, for example. As shown in FIG. 2, the blade 50 of each mating contact 52 may electrically connect to a conductive member, such as plating, an internal conductive path, a via, or the like, which, in turn, connects to the blade 50 of the mating contact 36. Further, as shown, each mating contact 52 may be oriented orthogonal to the mating contacts 36. Optionally, each mating contact 52 may be aligned similar to the corresponding mating contact 36 to which the mating contact 52 connects. The contact tails 56 of the mating contacts 52 extend out of the receptacle connector 28 into and through through-holes 60 formed through the PCB 14. The mating contacts 36 and 52 may be securely retained within the connector housing 16 such as through soldering.

Optionally, the mating contacts 36 and 52 may be various other conductive contacts that may be used within a connector housing. For example, the mating contacts may include ball/socket, tab/slot, or the like, mating connective ends.

Figure 4:
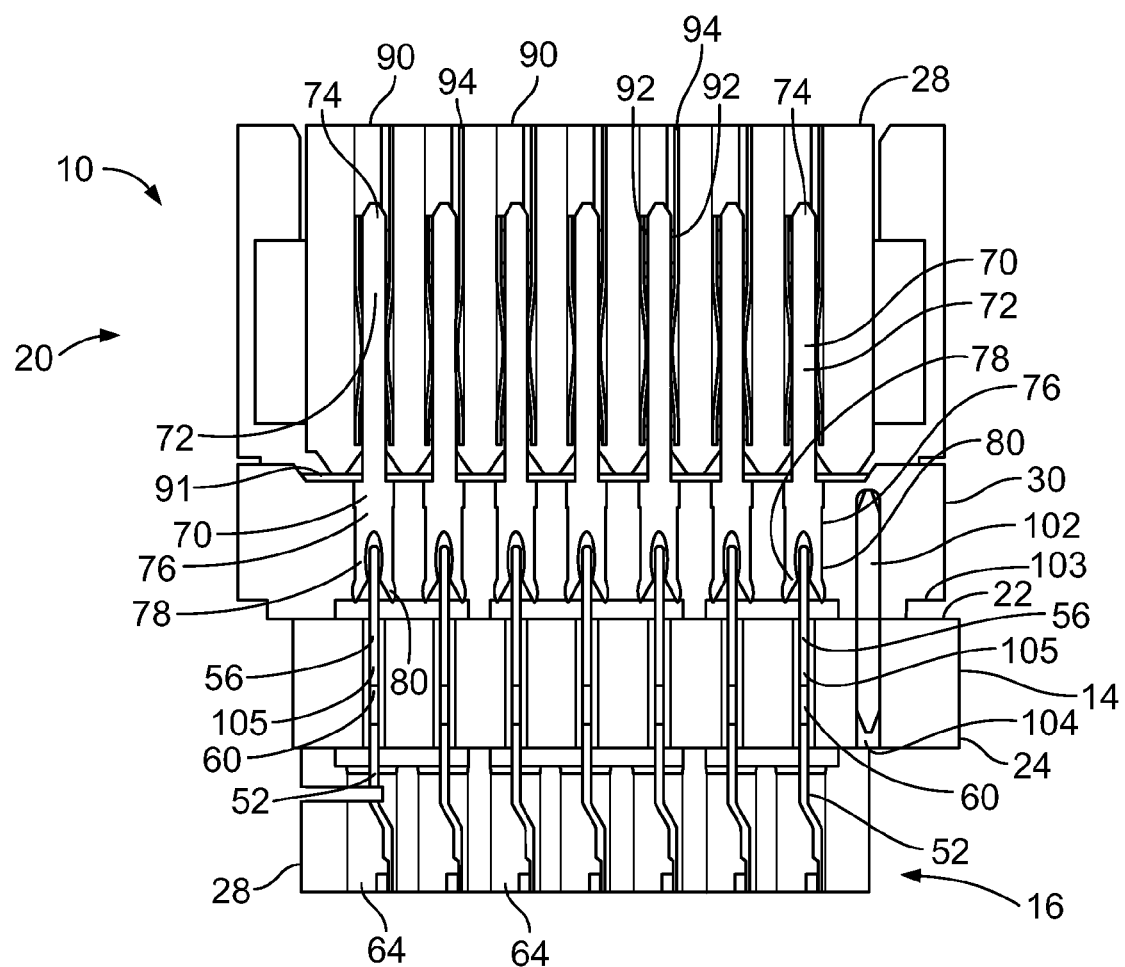
FIG. 4 illustrates a cross-sectional view of a mating contact interface of a connector system, according to an embodiment.

FIG. 4 illustrates a cross-sectional view of a mating contact interface of the connector system 10, according to an embodiment. As noted, the contact tails 56 of the mating contacts 52 extend out of the receptacle connector 28 and through the PCB 14. The mating contacts 52 may be secured to or within the PCB 14, and the connector housing 16 may then be positioned onto the PCB 14 such that the mating contacts 52 are mated into respective channels 64 of the receptacle connector 28. Optionally, the mating contacts 52 may first be secured within the respective channels 64 of the receptacle connector 28, and then passed into respective plated through-holes 60 formed through the PCB 14.

During mating, the engagement of the mating contacts 52 into the channels 64 of the receptacle connector 28 and the through-holes 60 of the PCB 14 securely connects the PCB 14 to the connector assembly 16.

Exposed ends of the contact tails 56 pass through the PCB 14 and extend into the header connector 30 of the connector assembly 20. The contact tails 56 connect to and mate with interconnecting contacts 70 securely retained within the connector housing 20.

Figure 5:
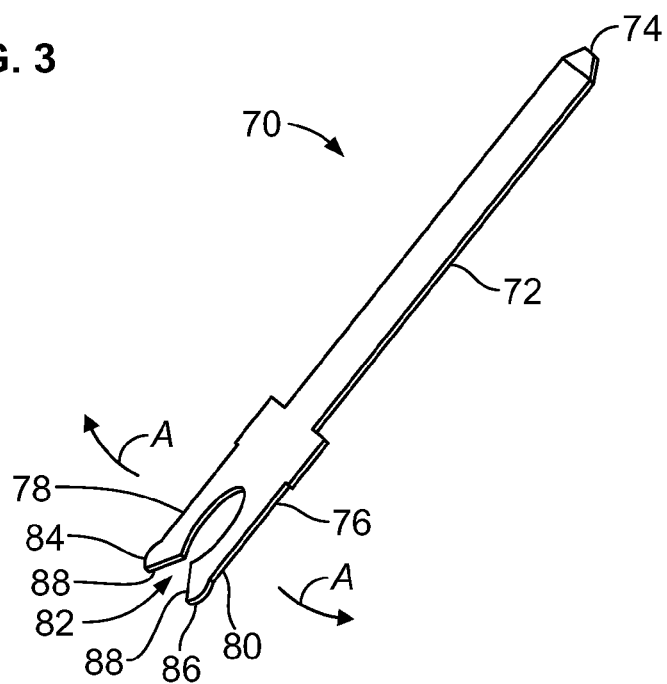
FIG. 5 illustrates a perspective view of an interconnecting contact, according to an embodiment.

FIG. 5 illustrates a perspective view of an interconnecting contact 70, according to an embodiment. Each interconnecting contact 70 includes a pin 72 having a beveled distal tip 74. A contact-engaging member 76 integrally connects to the pin 72 at an opposite end from the beveled distal tip 74. The contact-engaging member 76 may include an arrangement configured to electrically mate with a contact tail 56 of a mating contact 52. For example, the contact-engaging member 76 may be a socket into which the contact tail 56 is removably retained. As shown in FIG. 5, however, the contact-engaging member 76 includes opposed prongs 78 and 80 having a tail-engaging channel 82 formed therebetween. In this manner, the contact-engaging member 76 resembles a tuning fork. Free ends 84 and 86 of the prongs 78 and 80, respectively include inwardly-ramped surfaces 88 configured to guide a contact tail 56 of a mating contact 52 into the tail-engaging channel 82. As the contact tail 56 passes into the tail-engaging channel 82, the opposed prongs 78 and 80 flex outwardly in the directions of arrows A, to accommodate the contact tail 56. As such, the opposed prongs 78 and 80 exert an equal, but opposite force into the contact tail 56, ensuring a secure and even mating engagement. The free ends 78 and 80 may flex into an internal cavity 46 of an eye of the needle contact portion 42 of a respective mating contact 52. Optionally, the free ends 78 and 80 may compressively sandwich a planar beam portion of a respective mating contact 52.

Referring again to FIG. 4, the contact-engaging member 76 of each interconnecting contact 70 is retained within a respective plated channel 90 formed in the header connector 30. The pins 72 extend outwardly from a top surface 91 of the header connector 30 into aligned channels 90 within the receptacle connector 28.

Each pin 72 may be compressively sandwiched between opposed conductors 92, such as straps, beams, or the like, retained within a channel 90. The opposed conductors 92 may be spring-biased. Thus, as the pins 72 pass between the opposed conductors 92, the conductors 92 spread apart and exert a retaining force into either lateral edge of the pin 72. At least one of the opposed conductors 92 electrically connects to a conductive extension beam 94 that extends upwardly into the channel 90. The opposite end of the conductive extension beam 94 mates with a mating contact 100 that is retained by the PCB 18 and the receptacle connector 28 of the connector assembly 20. In addition to, or in lieu of, the extension beam 94, each channel 90 may include conductive plating that electrically connects the pin 72 with the mating contact 100. The mating contact 100 may be similar to that shown and described in FIG. 3. The mating contacts 36 may electrically connect to the mating contacts 52 in a similar fashion.

The interconnecting contacts 70 may be securely retained within the connector assembly 20. During a mating process, the connector assembly 20 is aligned with the PCB 14 such that the contact-engaging members 76 are positioned over the exposed contact tails 56 extending upwardly from the PCB 14. Additionally, an alignment post 102 extending downwardly from a mating face 103 of the header connector 30 of the connector assembly 20 is aligned with a passage 104 formed through the PCB 14. The post 102 and the passage 104 are configured to mate with one another to ensure proper alignment between the connector assembly 20 and the PCB 14. More posts 102 and passages 104 than shown may be used.

As the connector assembly 20 mates with the PCB 14, the contact tails 56 of the mating contacts 52 mate with the contact-engaging members 76. For example, the contact tails 56 of the mating contacts 52 pass into the tail-engaging channels 82 defined between the opposed prongs 78 and 80. The opposed prongs 78 and 80 securely connect to the contact tails 56.

As shown in FIGS. 2 and 4, the mating contacts 52 and the interconnecting contacts 70 mate with one another proximate the face 103 of the header connector 30. That is, the contact tails 56 pass only a short distance into the mating face, because at least portions of the contact-engaging members 76 extend outwardly from face 103. Therefore, the connection interface between the mating contacts 52 and the interconnecting contacts 70 is readily and easily accessed. Moreover, because the mating contacts 52 do not extend a substantial distance into the connector assembly 20, there is less chance of the mating contacts 56 bending or warping proximate mid-points or middle sections. Instead, only the end portions of the contact tails 56 extend from the PCB 14, leaving the intermediate middle sections, which may otherwise be susceptible to being bent, protected within the printed circuit board 14.

Thus, instead of using unitary, long contacts that extend through both layers of the printed circuit board 14 and substantial distances into both connector assemblies 16 and 20, the mating contacts 52 are securely retained within the PCB 14 and the PCB 18. However, the interconnecting contacts 70 are securely retained within the connector assembly 20 and mate with the mating contacts 56. Thus, the mating connection between the mating contacts 52 and the interconnecting mating contacts 70 is separable.

Optionally, each connector assembly 16 and 20 may include interconnecting contacts 70. The mating contacts secured within the PCB 14 may then include contact members, such as contact tails, that extend out of both layers 22 and 24 of the PCB 14. The contact-engaging members 76 of the interconnecting contacts 70 within the connector assembly 20 may mate with the contact members extending from the first layer 22, while the contact-engaging members 76 of the interconnecting contacts 70 within the connector assembly 16 may mate with the contact members extending from the second layer 24.

Additionally, the mating interface shown in FIG. 4 may be used with respect to the PCBs 12 and 18, as well, in order to interconnect the PCBs 12, 14, and 18 to additional PCBs. The pattern may be repeated, thereby propagating a continuous electrical path through multiple, parallel-stacked PCBs. The PCBs may electrically communicate with one another without an orthogonal back plane or other such component into which the PCBs would otherwise be edge-mounted.

Consequently, the system 10 may use standard-sized connector housings and mating contacts, as opposed to customized, long and possibly fragile mating contacts that span from one connector through a PCB and into another connector. Further, the separate mating interface between the mating contacts 52 and the interconnecting contacts 70 provides a stable connection between the contacts 52 and 70 that is less susceptible to shifting and warping as compared to previously-known longer contacts.

Embodiments provide a PCB feed-through interface in which mating contacts extend out of the PCB. However, instead of the mating contacts passing substantial distances into both connector assemblies on either side of the PCB, the mating contacts mate with separate and distinct interconnecting contacts retained within at least one of the connector assemblies. In this manner, the lengths of the mating contacts are reduced. Further, embodiments allow for the use of standard-sized connector housings and provide stable contact positioning. That is, because each mating contact does not have to pass substantial lengths into both connector assemblies, the length, size, and dimensions of the mating contact may be similar to that of a standard contact.

It is to be understood that the above description is intended to be illustrative, and not restrictive. In addition, the above-described embodiments (and/or aspects or features thereof) may be used in combination with each other. Furthermore, many modifications may be made to adapt a particular situation or material to the teachings of the embodiments without departing from their scope.

While various spatial and directional terms, such as top, bottom, lower, mid, lateral, horizontal, vertical, front and the like may be used to describe embodiments, it is understood that such terms are merely used with respect to the orientations shown in the drawings. The orientations may be inverted, rotated, or otherwise changed, such that an upper portion is a lower portion, and vice versa, horizontal becomes vertical, and the like.

Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A system for connecting multiple electrical components, the system comprising:
a first printed circuit board (PCB) having first and second opposed layers and a plurality of plated through-holes extending between the first and second opposed layers;
a plurality of PCB mating contacts, wherein each of the plurality of PCB mating contacts is retained within one of the plurality of plated through-holes, and wherein each of the plurality of PCB mating contacts comprises a first end portion that outwardly extends from the first layer, and a second end portion that outwardly extends from the second layer; and
a first connector assembly having a plurality of interconnecting contacts retained therein, wherein the plurality of interconnecting contacts mate with the first end portions of the plurality of PCB mating contacts when the first connector assembly connects to the first PCB, wherein the first connector assembly further comprises a plurality of connector mating contacts connected to the plurality of interconnecting contacts, and wherein the plurality of connector mating contacts are separate and distinct from the plurality of interconnecting contacts.

2. The system of claim 1, wherein the plurality of interconnecting contacts are configured to separate from the first end portions of the plurality of PCB mating contacts when the first connector assembly is disconnected from the first PCB.

3. The system of claim 1, wherein the plurality of connector mating contacts connect to the plurality of interconnecting contacts through plating within the first connector assembly.

4. The system of claim 1, wherein the plurality of connector mating contacts connect to the plurality of interconnecting contacts through opposed conductors within the first connector assembly.

5. The system of claim 1, further comprising a second connector assembly, wherein the second end portions of the plurality of PCB mating contacts are retained within the second connector assembly.

6. The system of claim 5, further comprising a second PCB connected to the first connector assembly.

7. The system of claim 6, further comprising a third PCB connected to the second connector assembly.

8. The system of claim 1, wherein each of the plurality of interconnecting contacts comprises a pin integrally formed with a contact-engaging member that mates with the first end portion.

9. The system of claim 8, wherein the contact-engaging member comprises opposed prongs separated by a tail-engaging channel.

10. The system of claim 1, wherein each of the first end portions of the plurality of PCB mating contacts comprises an eye-of-the-needle contacting portion.

11. The system of claim 1, wherein the first PCB further comprises a passage, and wherein the first connector assembly further comprises an alignment post that is retained within the passage.

12. A system for communicating between multiple electrical components, the system comprising:
a first printed circuit board (PCB) having first and second opposed layers and a plurality of plated through-holes extending between the first and second opposed layers;
a plurality of PCB mating contacts, wherein each of the plurality of PCB mating contacts is retained within one of the plurality of plated through-holes, and wherein each of the plurality of PCB mating contacts comprises first and second end portions integrally connected to one another through an intermediate middle section, wherein each of the first end portions outwardly extends from the first layer, and wherein each of the second end portions outwardly extends from the second layer;
a first connector assembly having a plurality of interconnecting contacts and a plurality of connector mating contacts retained therein, wherein the plurality of connector mating contacts are separate and distinct from the plurality of interconnecting contacts, wherein the plurality of interconnecting contacts mate with the first end portions of the plurality of PCB mating contacts when the first connector assembly connects to the first PCB, and wherein the plurality of interconnecting contacts are separate and distinct from the first end portions of the plurality of PCB mating contacts, wherein the plurality of connector mating contacts are connected to the plurality of interconnecting contacts;

a second connector assembly, wherein the second end portions of the PCB mating contacts are retained within the second connector assembly;
a second PCB connected to the first connector assembly; and
a third PCB connected to the second connector assembly.

13. The system of claim 12, wherein the plurality of connector mating contacts connect to the plurality of interconnecting contacts through plating within the first connector assembly.

14. The system of claim 12, wherein the plurality of connector mating contacts connect to the plurality of interconnecting contacts through opposed conductors within the first connector assembly.

15. The system of claim 12, wherein each of the plurality of interconnecting contacts comprises a pin integrally formed with a contact-engaging member that mates with the first end portion.

16. The system of claim 15, wherein the contact-engaging member comprises opposed prongs separated by a tail-engaging channel.

17. The system of claim 12, wherein each of the first end portions of the plurality of PCB mating contacts comprises an eye-of-the-needle contacting portion.

18. The system of claim 12, wherein the first PCB further comprises a passage, and wherein the first connector assembly further comprises an alignment post that is retained within the passage.

19. The system of claim 12, wherein at least one of the first and second connector assemblies comprises a receptacle mated with a header connector.

20. A system for connecting multiple electrical components, the system comprising:
a first printed circuit board (PCB) having first and second opposed layers and a plurality of plated through-holes extending between the first and second opposed layers, wherein the first PCB further comprises a passage;
a plurality of mating contacts, wherein each of the plurality of mating contacts is retained within one of the plurality of plated through-holes, and wherein each of the plurality of mating contacts comprises a first end portion that outwardly extends from the first layer, and a second end portion that outwardly extends from the second layer; and
a first connector assembly having a plurality of interconnecting contacts retained therein, wherein the plurality of interconnecting contacts mate with the first end portions of the plurality of mating contacts when the first connector assembly connects to the first PCB, and wherein the first connector assembly further comprises an alignment post that is retained within the passage.

* * * * *